(12) United States Patent
Tang et al.

(10) Patent No.: US 12,428,719 B2
(45) Date of Patent: Sep. 30, 2025

(54) MULTILAYER COATING FOR INTERFACE CONES

(71) Applicant: AGILENT TECHNOLOGIES, INC., Santa Clara, CA (US)

(72) Inventors: Jing Tang, Santa Clara, CA (US); Elizabeth Carr, Santa Clara, CA (US)

(73) Assignee: AGILENT TECHNOLOGIES, INC., Santa Clara, CA (US)

( * ) Notice: Subject to any disclaimer, the term of this patent is extended or adjusted under 35 U.S.C. 154(b) by 0 days.

(21) Appl. No.: 18/262,680

(22) PCT Filed: Feb. 24, 2022

(86) PCT No.: PCT/US2022/017750
§ 371 (c)(1),
(2) Date: Jul. 24, 2023

(87) PCT Pub. No.: WO2022/231690
PCT Pub. Date: Nov. 3, 2022

(65) Prior Publication Data
US 2024/0093353 A1 Mar. 21, 2024

Related U.S. Application Data

(60) Provisional application No. 63/179,956, filed on Apr. 26, 2021.

(51) Int. Cl.
*C23C 14/16* (2006.01)
*B32B 15/01* (2006.01)
(Continued)

(52) U.S. Cl.
CPC .............. *C23C 14/16* (2013.01); *B32B 15/01* (2013.01); *B32B 15/018* (2013.01); *B32B 15/04* (2013.01);
(Continued)

(58) Field of Classification Search
CPC ..... C23C 14/16; C23C 14/024; C23C 14/025; C23C 14/34; C23C 14/165; C23C 18/32;
(Continued)

(56) References Cited

U.S. PATENT DOCUMENTS 5,793,039 A 8/1998 Oishi et al.
7,335,877 B1 2/2008 Han et al.
(Continued)

FOREIGN PATENT DOCUMENTS

EP 1666629 A2 6/2006
WO 2018163576 A1 9/2018

OTHER PUBLICATIONS

Examination Report for GB Application No. GB2317907.0, dated Oct. 1, 2024, 4 pages.
(Continued)

*Primary Examiner* — Michael E. La Villa
(74) *Attorney, Agent, or Firm* — Lando & Anastasi, LLP

(57) ABSTRACT

A multilayer coating including an adhesion layer; and a protective coating is disclosed. The multilayer coating can be applied to a portion of at least one of a base and a tip of an interface cone. A method of making a coated interface cone is also disclosed.

13 Claims, 7 Drawing Sheets

(51) Int. Cl.

| | |
|---|---|
| *B32B 15/04* | (2006.01) |
| *B32B 15/20* | (2006.01) |
| *C23C 14/02* | (2006.01) |
| *C23C 14/34* | (2006.01) |
| *C23C 18/32* | (2006.01) |
| *C23C 28/00* | (2006.01) |
| *C23C 30/00* | (2006.01) |
| *C25D 3/12* | (2006.01) |
| *H01J 49/06* | (2006.01) |
| *G01N 27/62* | (2021.01) |
| *H01J 49/10* | (2006.01) |

(52) U.S. Cl.
CPC .......... *B32B 15/043* (2013.01); *B32B 15/20* (2013.01); *C23C 14/024* (2013.01); *C23C 14/025* (2013.01); *C23C 14/165* (2013.01); *C23C 14/34* (2013.01); *C23C 18/32* (2013.01); *C23C 28/322* (2013.01); *C23C 30/00* (2013.01); *C23C 30/005* (2013.01); *C25D 3/12* (2013.01); *H01J 49/067* (2013.01); *G01N 27/62* (2013.01); *H01J 49/105* (2013.01); *Y10T 428/12806* (2015.01); *Y10T 428/12826* (2015.01); *Y10T 428/12847* (2015.01); *Y10T 428/12854* (2015.01); *Y10T 428/12861* (2015.01); *Y10T 428/12868* (2015.01); *Y10T 428/12875* (2015.01); *Y10T 428/12882* (2015.01); *Y10T 428/12903* (2015.01); *Y10T 428/1291* (2015.01); *Y10T 428/12917* (2015.01); *Y10T 428/12937* (2015.01); *Y10T 428/12944* (2015.01); *Y10T 428/12986* (2015.01); *Y10T 428/12993* (2015.01); *Y10T 428/2495* (2015.01); *Y10T 428/24959* (2015.01); *Y10T 428/24967* (2015.01); *Y10T 428/24975* (2015.01); *Y10T 428/24992* (2015.01); *Y10T 428/26* (2015.01); *Y10T 428/261* (2015.01); *Y10T 428/263* (2015.01); *Y10T 428/264* (2015.01); *Y10T 428/265* (2015.01)

(58) Field of Classification Search
CPC ..... C23C 18/322; C23C 30/00; C23C 30/005; C25D 3/12; H01J 49/067; H01J 49/105; G01N 27/62; B32B 15/01; B32B 15/018; B32B 15/04; B32B 15/043; B32B 15/20; Y10T 428/12806; Y10T 428/12826; Y10T 428/12847; Y10T 428/12854; Y10T 428/12861; Y10T 428/12868; Y10T 428/12875; Y10T 428/12882; Y10T 428/12903; Y10T 428/1291; Y10T 428/12944; Y10T 428/12937; Y10T 428/12986; Y10T 428/12993; Y10T 428/12917; Y10T 428/261; Y10T 428/263; Y10T 428/264; Y10T 428/265; Y10T 428/26; Y10T 428/2495; Y10T 428/24959; Y10T 428/24967; Y10T 428/24975; Y10T 428/24992

See application file for complete search history.

(56) References Cited

U.S. PATENT DOCUMENTS

| | | | |
|---|---|---|---|
| 2003/0146378 A1* | 8/2003 | Mordehai | H01J 49/04 250/288 |
| 2005/0079368 A1 | 4/2005 | Gorman et al. | |
| 2008/0152814 A1* | 6/2008 | Rucker | C23C 4/18 427/404 |
| 2009/0239061 A1 | 9/2009 | Hazel et al. | |

OTHER PUBLICATIONS

"ICP-MS Interface Cones: Maintaining the Critical Interface between the Mass Spectrometer and the Plasma Discharge to Optimize Performance and Maximize Instrument Productivity", Inductively coupled plasma-Mass Spectroscopy (ICP-MS), Spectroscopy Jul. 2019, vol. 34, issue 7, pp. 12-17.

Krushevska Antoaneta P., Zhou Ying, Ravikumar V., Kim Young-Jin, Hinrichs Joachim, "Chromium based polyatomic interferences on rhodium in ICP-MS", Journal of Analytical Atomic Spectrometry, (Jan. 1, 2006), vol. 21, No. 9, doi:10.1039/b602266a, ISSN 0267-9477, pp. 847-855, XP055980213.

"International Search Report and Written Opinion, PCT Application No. PCT/US2022/017750", Jun. 15, 2022, 9 pages.

* cited by examiner

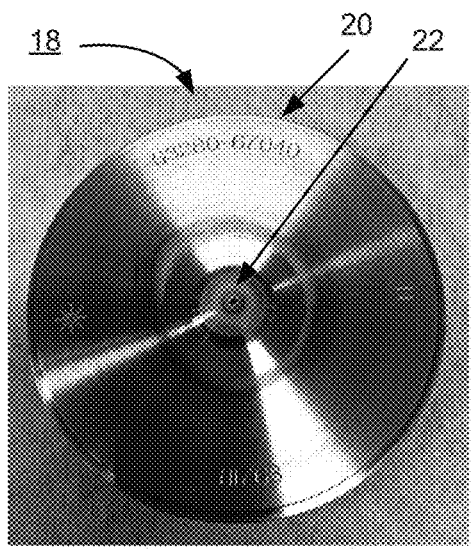
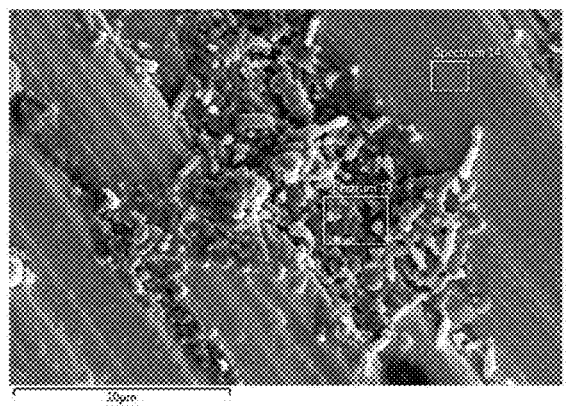
FIG. 8A    FIG. 8B
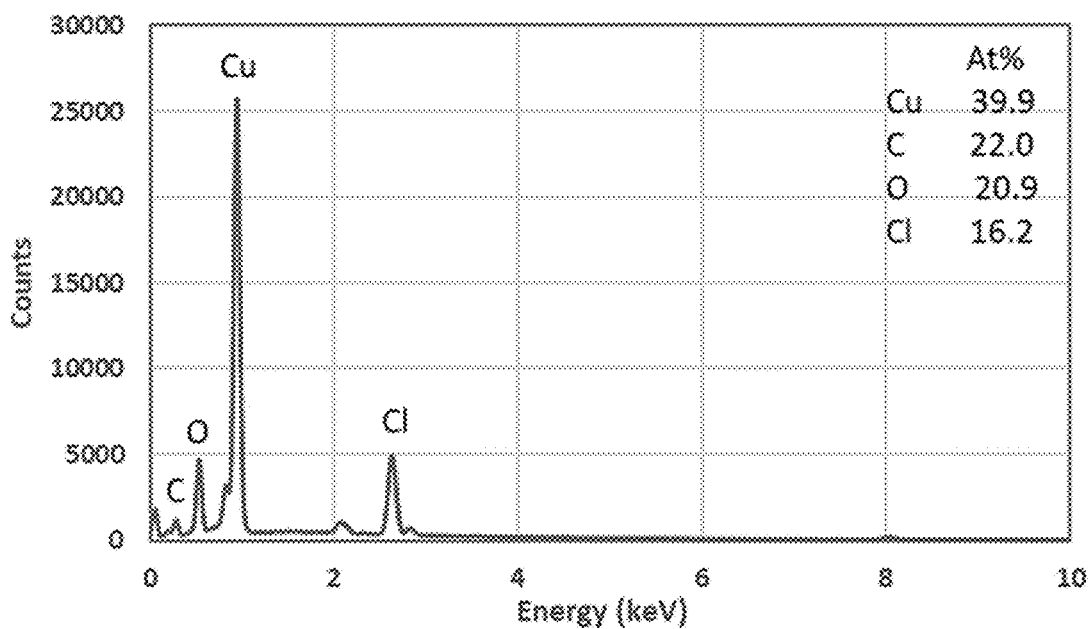
FIG. 8C

MULTILAYER COATING FOR INTERFACE CONES

RELATED APPLICATION

This application is a national stage filing under 35 U.S.C 371 of PCT application number PCT/US2022/017750, having an international filing date of Feb. 24, 2022, which claims priority to U.S. Provisional Application No. 63/179,956, filed Apr. 26, 2021, the disclosures of which is are hereby incorporated by reference in its entirety their entireties.

FIELD OF THE INVENTION

The present disclosure generally relates to a multilayer coating including an adhesion layer; and a protective coating. The multilayer coating can be applied to a portion of at least one of a base and a tip of an interface cone. A method of making a coated interface cone is also disclosed.

BACKGROUND OF THE INVENTION

Interface cones, which are composed of sampler and skimmer cones, of an Inductively Coupled Plasma-Mass Spectrometer (ICP-MS) transport ions from the plasma to the mass spectrometer. The tip areas of the interface cones are subjected to highly corrosive acids at high temperatures (about 1000° C. near the orifice). An interface cone can include a tip and a base.

For both the sampler and skimmer cone, the tip can be made of nickel or platinum. The nickel tip is a standard economic option suitable for most applications. The platinum tip is more expensive, but is required for aggressive acids, and is used in the semiconductor industry. The platinum tip can come in different sizes, but the larger sizes increase the expense.

For the sampler cone, the base material is copper due to its excellent thermal conductivity, but the copper is not resistant to acids. With a platinum tip sampler cone, the copper base material gets corroded, and detaches from the platinum tip resulting in the premature failure of the interface cone.

For the skimmer cone, the base material is nickel for both the nickel and platinum tip. However, nickel is not resistant to aggressive acids, such as sulfuric acid, phosphoric acid, hydrofluoric acid, or an organic matrix.

For many applications, such as in the semiconductor industry, transition metals such as copper and nickel are analytes of interest and it is important to lower their background signal and lower their limit of detection. So, the presence of copper and nickel in an interface cone (base and/or tip) would contribute to an increased background signal rendering their use in the semiconductor industry unacceptable.

Previously, a platinum coating has been applied to interface cones. However, coating, such as ion plating or plasma chemical vapor deposition, a cone with platinum, for example, at a thickness of about 20 µm, was prohibitively expensive. Additionally, copper from the base of the cone diffused into the platinum coating increasing the background signal. In other instances, the cone was coated with gold. However, a gold coating is not sufficient because gold has a low melting point, i.e., even lower than nickel, and was readily dissolved in corrosive acids commonly used in ICP-MS.

During a lifetime of an interface cone, salts and/or oxides build-up on the surface, which requires cleaning to maximize performance and instrument productivity. It would be advantageous to have an interface cone that required minimal cleaning times.

What is needed is a multilayer coating that can be applied to a portion of an interface cone. The multilayer coating can provide one or more benefits: reduce a background signal attributed to a presence of Cu and/Ni in the interface cone; withstand high temperatures and corrosive acids; and minimize cleaning times of an interface cone.

BRIEF DESCRIPTION OF THE DRAWINGS

Features of the present disclosure are illustrated by way of example and not limited in the following figure(s), in which like numerals indicate like elements, in which:

FIG. 8A is an illustration of an interface cone with a multilayer coating according to an aspect of the invention; FIG. 8B is a scanning electron microscope (SEM) illustration showing various nanostructures formed on a base of the interface cone; and FIG. 8C is a EDS mapping of the interface cone with a multilayer coating according to an aspect of the invention.

SUMMARY OF THE INVENTION

In an aspect, there is disclosed a multilayer coating, comprising an adhesion layer; and a protective coating.

In another aspect, there is disclosed a method of method of making a coated interface cone, comprising providing an interface cone with a base and a tip; depositing an adhesion layer to a portion of at least one of the base and the tip; and depositing a protective layer.

Additional features and advantages of various embodiments will be set forth, in part, in the description that follows, and will, in part, be apparent from the description, or can be learned by the practice of various embodiments. The objectives and other advantages of various embodiments will be realized and attained by means of the elements and combinations particularly pointed out in the description herein.

DETAILED DESCRIPTION OF THE INVENTION

For simplicity and illustrative purposes, the present disclosure is described by referring to examples thereof. In the following description, numerous specific details are set forth in order to provide a thorough understanding of the present disclosure. It will be readily apparent however, that the present disclosure may be practiced without limitation to these specific details. In other instances, some methods and structures have not been described in detail so as not to unnecessarily obscure the present disclosure.

Additionally, the elements depicted in the accompanying figures may include additional components and some of the components described in those figures may be removed and/or modified without departing from scopes of the present disclosure. Further, the elements depicted in the figures may not be drawn to scale and thus, the elements may have sizes and/or configurations that differ from those shown in the figures. Any references to "top" or "bottom" are for ease of understanding positions relative to another element and should not be considered limiting. Additionally, if more than one element is present, then the element is identified as a first, second, third, etc. for ease of understanding.

In its broad and varied embodiments, disclosed herein is a coating, and an article, such as an ion transfer device including the coating; and methods of making and using the coatings, and the articles.

Figure 1:
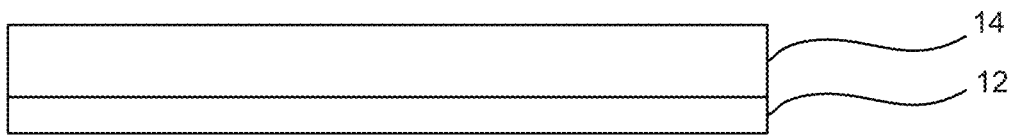
FIG. 1 is a multilayer coating according to an aspect of the invention.

The present disclosure describes a multilayer coating 10 including an adhesion layer 12; and a protective coating 14, as shown in FIG. 1. The multilayer coating 10 can be deposited on a portion of an interface cone 18 to assist in transporting ions from plasma to a mass spectrometer. The protective coating 14 can extend the interface cone 18 lifetime. The protective coating 14 can also reduce a material from a base 20 of an interface cone 18 from producing a background signal. The adhesion layer 12 can improve adhesion of the protective coating 14 to a portion of at least one surface of the base 20 and the tip 22. In an aspect, a diffusion barrier 16 can be included in the multilayer coating 10 to reduce and/or limit the diffusion of ions from a material of a base 20 to the protective coating 14.

The protective coating 14 can be subjected to corrosive acids at a temperature of about 1000° C. For this reasons, the protective coating 14 can have a melting temperature greater than about 1000° C. In an aspect, the protecting coating 14 can have a melting temperature greater than a melting temperature of a material present in a tip of an interface cone. For example, if a tip of an interface cone is nickel, then the protective coating 14 can have a melting temperature greater than the melting temperature of nickel, e.g., about 1455° C. Similarly, if a tip of an interface cone is platinum, then the protective coating 14 can have a melting temperature greater than the melting temperature of platinum, e.g., about 1768° C.

The protective coating 14 can be insoluble in acids having a pH in a range from about 1 to about 7. The protective coating 14 can be resistant to the corrosive effects of an acid used in a mass spectrometer, such as an Inductively Coupled Plasma-Mass Spectrometer. The protective coating can be insoluble in bases and organic solutions and be insoluble in acids with pH<1. The protective coating can be resistant to damage from ion bombardment created by a plasma. The protective coating can be resistant to interaction with organic solutions and formation of carbides.

The protective coating 14 can be present in the multilayer coating 10 in a thickness ranging from about 0.05 μm to about 19 μm, for example, from about 0.1 μm to about 15 μm, and as a further example, from about 0.75 μm to about 12 μm. In an aspect, the protective coating 14 can be present in a thickness less than about 6 μm, for example, from about 2 μm to about 6 μm. In an aspect, the protective coating 14 can be present in the multilayer coating 10 in a thickness that can provide resistance to corrosive acids and/or to high temperatures to an interface cone 18.

The protective coating 14 can be a single layer of platinum at a thickness from about 2 μm to about 6 μm, for example, from about 4 μm. The protective coating 14 can have a purity greater than about 95% and a density close to a density of the bulk material of the protective coating. For example, if the protective coating consists of platinum, then it can have a density close to a density of bulk platinum of about 21.45 g/cm³. The protective coating 14 can be applied using a sputtering deposition process (for example, up to a thickness of about 4 μm) or an electroplating deposition process (for example, up to a thickness of about 6 μm).

The multilayer coating 10 can include an adhesion layer 12. The adhesion layer 12 can be made from any material that can increase adhesion between the protective coating 14 and a material of a base 20 and/or a tip 22. The adhesion layer 12 can be made of at least one material chosen from titanium, chromium, tungsten, and combinations thereof. The adhesion layer 12 can be a single layer. The adhesion layer 12 can be one or more layers, for example, a first adhesion layer 12a, a second adhesion layer 12b, etc. If the adhesion layer 12 includes more than one layer, then each adhesion layer 12 can be made from a same or different material, including combinations of different materials.

The adhesion layer 1 can be present in the multilayer coating at a thickness ranging from about 10 nm to about 500 nm, for example, from about 15 nm to about 475 nm, and as a further example, from about 20 nm to about 450 nm.

The multilayer coating 10 can be applied to a portion of at least one of the base 20 and the tip 22 of an interface cone. For example, if the base 20 is nickel, then the adhesion layer 12 can be a sputtered titanium or chromium; and the protective layer 14 can be a sputtered platinum, as shown in FIG. 1.

Figure 3:
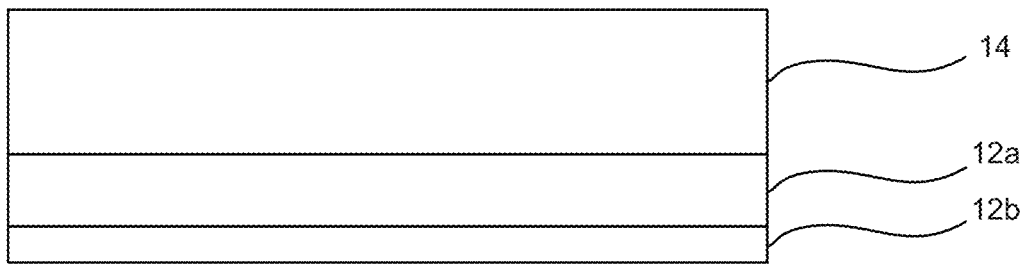
FIG. 3 is a multilayer coating according to another aspect of the invention.

In another aspect, as shown in FIG. 3, the adhesion layer 12 can be multiple layers, such as a first adhesion layer 12a and a second adhesion layer 12b. A second adhesion layer 12b can be a sputtered titanium or chromium. A first adhesion layer 12a can be a sputtered platinum, which can serve as an adhesion layer for the protective layer 14. The protective layer 14 can be an electroplated platinum.

The multilayer coating 10 can also include a diffusion barrier layer 16. The diffusion barrier layer 16 can be applied to a surface of an interface cone 18. The diffusion barrier layer 16 can be made of one or more materials that can reduce and/or prevent diffusion of ions from a base 20 material into the protective coating 14. In an aspect, the diffusion barrier layer 16 can be made of at least one material chosen from electrolytic nickel, electroless nickel, and combinations thereof.

The diffusion barrier layer 16 can be present at a thickness greater than about 500 nm, for example, from about 2 μm to about 30 μm, and as a further example from about 4 μm to about 25 μm.

Figure 2:
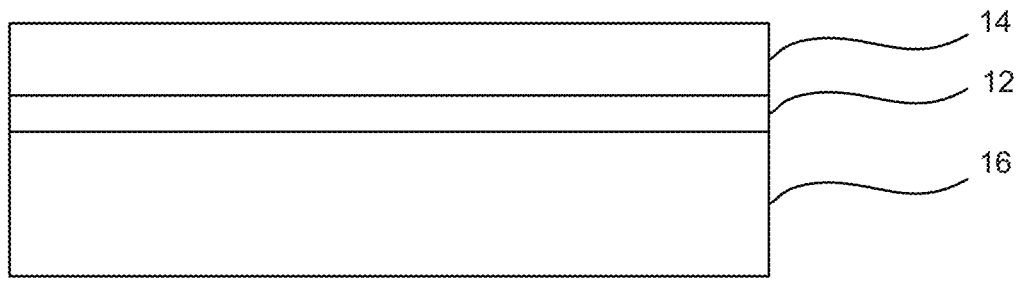
FIG. 2 is a multilayer coating according to another aspect of the invention.

As shown in FIG. 2, if the base 20 is copper, then the multilayer coating 10 can additionally include a diffusion barrier 16 of nickel. Additionally, the multilayer coating 10 can include the adhesion layer 12 of sputtered titanium or chromium; and the protective layer 14 of a sputtered platinum.

Figure 4:
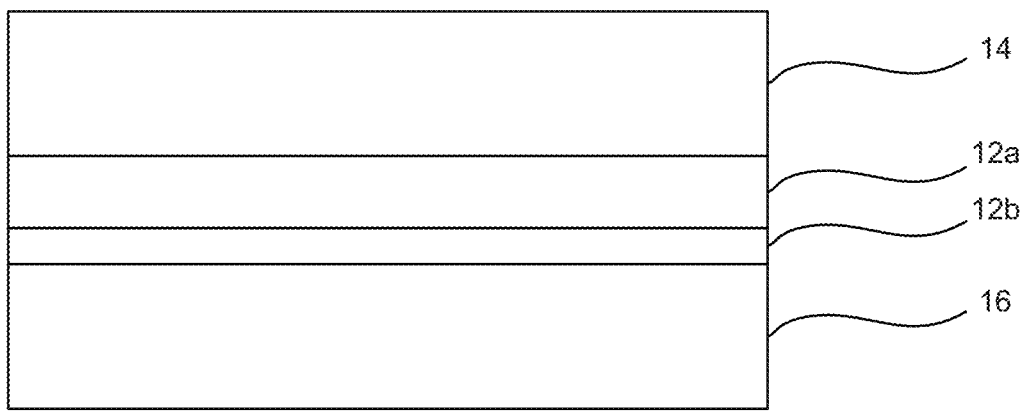
FIG. 4 is a multilayer coating according to another aspect of the invention.

In another aspect, as shown in FIG. 4, the adhesion layer 12 can be multiple layers, such as a first adhesion layer 12a and a second adhesion layer 12b. A second adhesion layer 12b can be a sputtered titanium or chromium. A first adhesion layer 12a can be a sputtered platinum, which can serve as an adhesion layer for the protective layer 14. The first adhesion layer 12a, in this instance, is not intended to increase a thickness of the protective layer 14. The protective layer 14 can be an electroplated platinum.

An interface cone 18 can include a base 20; and a tip 22; wherein a portion of at least one of the base 20 and the tip 22 are coated with the disclosed multilayer coating 10. In an aspect, an entire surface of the tip 22 is coated with the disclosed multilayer coating 10. In another aspect, less than 100% of the surface of the tip 22 is coated with the disclosed multilayer coating 10. In an aspect, an entire surface of the base 20 is coated with the disclosed multilayer coating 10. In another aspect, less than 100% of the surface of the base 20 is coated with the disclosed multilayer coating 10. In a further aspect, the entire surface of both the base 20 and the tip 22 are coated with the disclosed multilayer coating 10. In another aspect, less than 100% of the surface of each of the base 20 and the tip 22 is coated with the disclosed multilayer coating 10.

The base 20 can be made of at least one material chosen from copper and nickel. The tip 22 can be made of at least one material chosen from nickel and platinum. In an aspect, the interface cone 18 can include a base 20 made of copper, and a tip 22 made of platinum. The multilayer coating 10 can also include a diffusion barrier layer of nickel.

A method of making a coated interface cone can include providing an interface cone 18 having a base 20 and a tip 22. An adhesion layer 12 can be deposited to a portion of at least one of the base 20 and the tip 22. A protective layer 14 can be deposited on the adhesion layer 12.

The protective layer 14 can be deposited using conventional deposition techniques. In an aspect, the protective layer 14 can be deposited by sputtering platinum. In another aspect, the protective layer 14 can be deposited by electroplating platinum. Other deposition techniques include, but are not limited to, thermal evaporation, e-beam evaporation, chemical vapor deposition, and atomic layer deposition.

In an aspect, the adhesion layer 12 can be deposited using standard deposition techniques. In an aspect, the adhesion layer 12 can be depositing by sputtering.

The interface cone 18 can include a base 20 of copper. In an aspect, the multilayer coating 10 can further include depositing a diffusion barrier layer 16 before deposition of the adhesion layer 12. The diffusion barrier layer 16 can be made of at least one material chosen from electrolytic nickel, electroless nickel, and combinations thereof.

EXAMPLES

Figure 5:
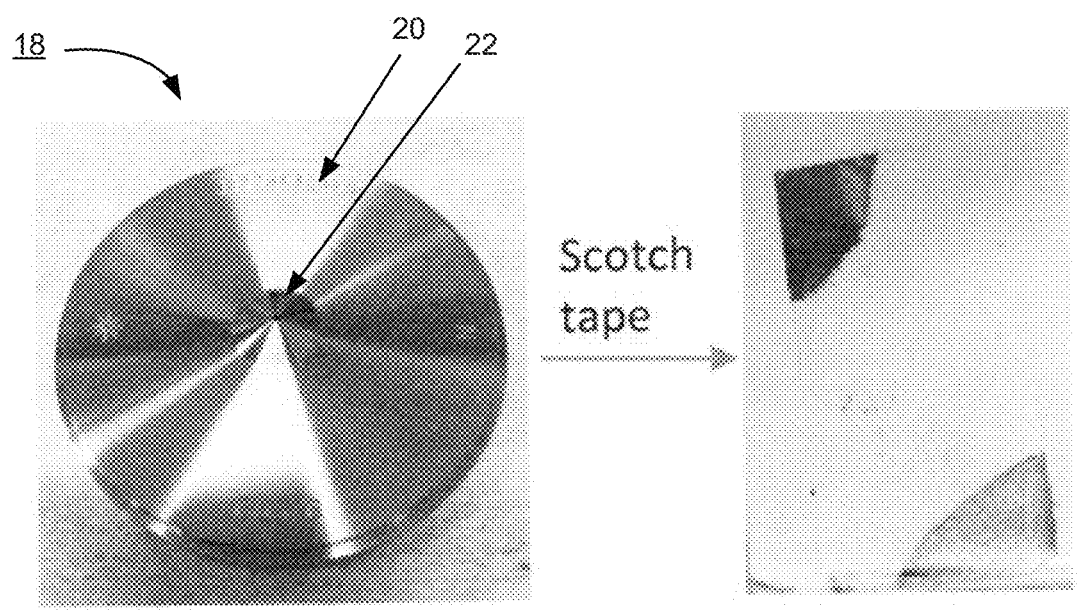
FIG. 5 is an illustration of a comparative interface cone including a protecting coating, but without an adhesion layer.

Comparative Example 1—As shown in FIG. 5, an interface cone 18 with a copper base 20 material and a nickel tip 22 material was coated with a single layer of platinum by e-beam evaporation. The platinum coating did not adhere to the copper base 20 material or the nickel tip 22. Scotch tape was applied to the tip 22 and the base 20 and removed, which also removed the platinum coating from both the copper base 20 and the nickel tip 22.

Example 1—An interface cone 18 with a copper base 20 material and a nickel tip 22 material was coated with a multilayer coating 10 including a protective coating 14 and an adhesion layer 12. As the adhesion layer 12, titanium was deposited by sputtering onto a portion of at least one of the copper base 20 and the nickel tip 22. A protective coating 14 of platinum was applied, by sputtering, to the adhesion layer 12 of titanium. Scotch tape was applied to the tip 22 and the base 20 and was removed. The removed Scotch tape did not include any of the protective coating 14 and/or the adhesion coating 12.

Figure 7A:
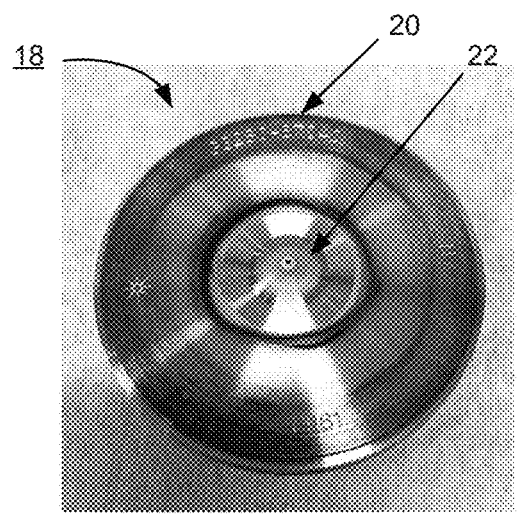
FIG. 7A is an illustration of an interface cone with a multilayer coating according to an aspect of the invention.
Figure 7B:
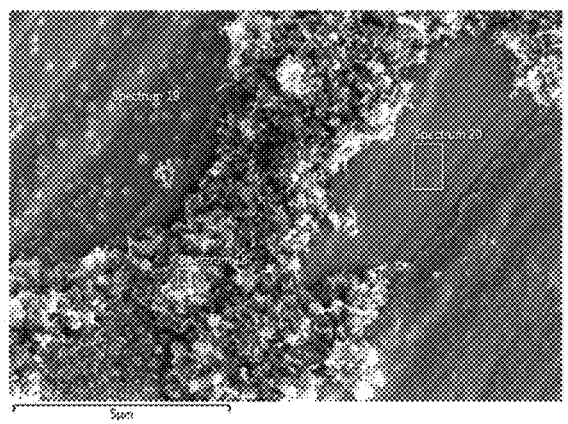
FIG. 7B is a scanning electron microscope (SEM) illustration showing various nanostructures formed on a base of the interface cone.
Figure 7C:
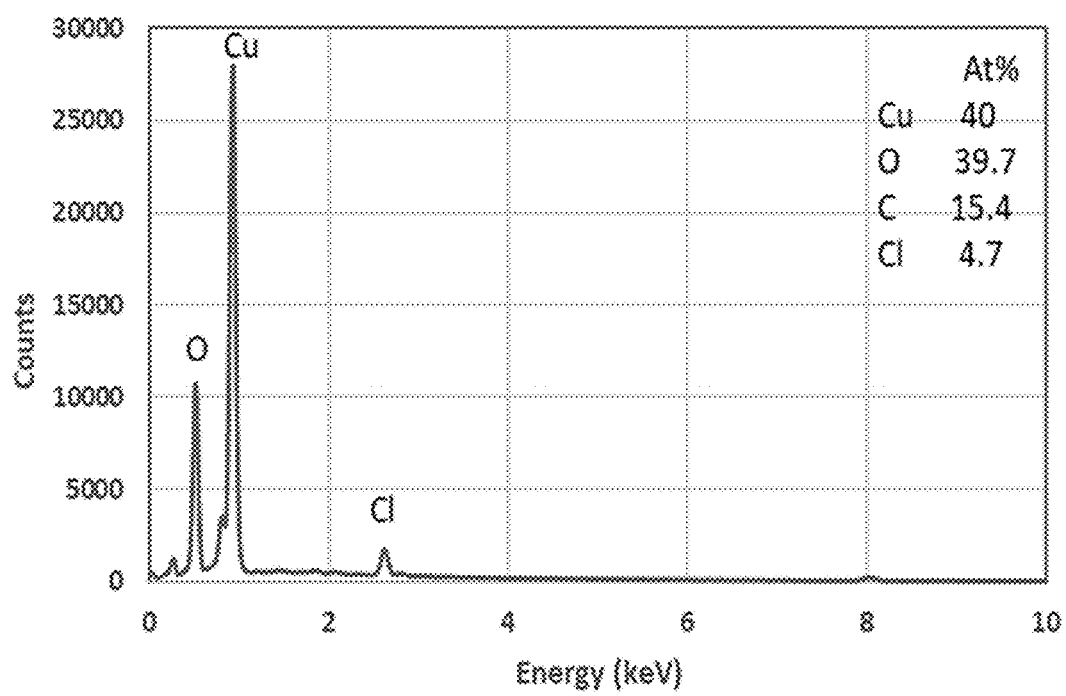
FIG. 7C is a EDS mapping of the interface cone with a multilayer coating according to an aspect of the invention.

Comparative Example 2—An interface cone 18 including copper as a base 20 material and nickel as a tip 22 material was used. A multilayer coating 10 was applied onto a portion of at least one of the base 20 and tip 22. The multilayer coating 10 included 100 nm of sputtered titanium (adhesion layer 12) and 1 μm of sputtered platinum (protective coating 14), as shown in FIG. 7A. The interface cone 18 was run in ICP-MS for six hours. Part of the surface showed copper color. Scanning electron microscope/energy dispersive spectroscopy (SEMS/EDS) analysis of the base 20 showed various copper nanostructures (e.g., evidence of copper ion diffusion), as shown in FIGS. 7B and 7C.

Comparative Example 3—An interface cone 18 including copper as a base 20 material and nickel as a tip 22 material was used. A multilayer coating 10 was applied onto a portion of at least one of the base 20 and tip 22, as shown in FIG. 8A. The multilayer coating 10 included 100 nm of sputtered titanium (adhesion layer 12) and 1 μm of sputtered platinum (protective coating 14). The multilayer coating 10 also included a diffusion barrier layer 16 of 500 nm sputtered nickel positioned between the adhesion layer 12 and the protective layer 14. The interface cone 18 was run in ICP-MS for six hours. Part of the surface showed copper color. Scanning electron microscope/energy dispersive spectroscopy (SEMS/EDS) analysis of the base 20 showed various copper nanostructures, as shown in FIGS. 8B and 8C.

Figure 6:
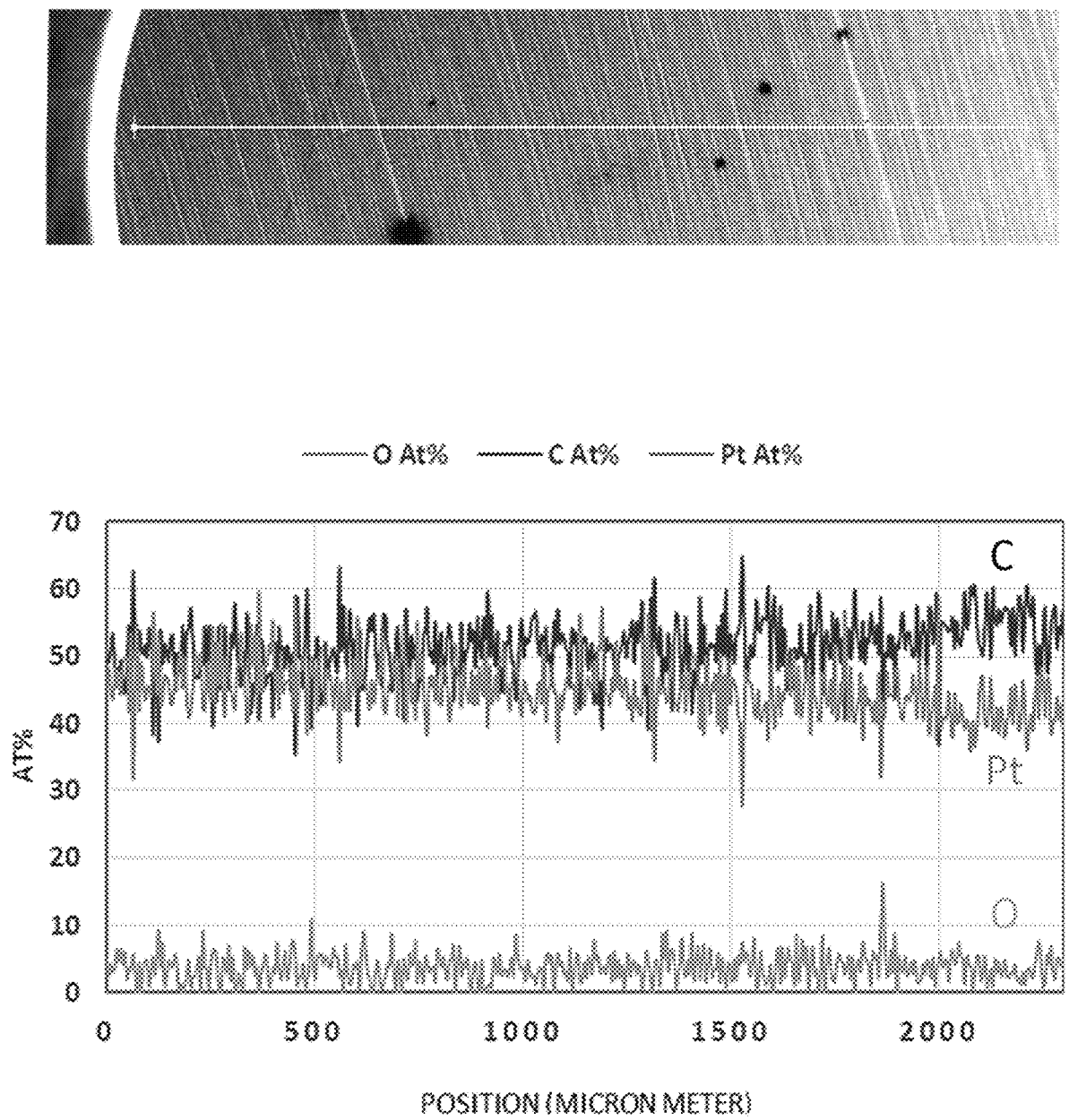
FIG. 6 is an Energy Dispersive Spectroscopy (EDS) mapping of an interface cone with a multilayer coating according to an aspect of the invention.

Example 2—An interface cone 18 including copper as a base 20 material and nickel as a tip 22 material was used. A multilayer coating 10 was applied onto a portion of at least one of the base 20 and tip 22. The multilayer coating 10 included 100 nm of sputtered titanium (adhesion layer 12) and 1 μm of sputtered platinum (protective coating 14). The multilayer coating 10 also included a diffusion barrier layer 16 of 2-30 micron electroplated nickel positioned between the adhesion layer 12 and the protective layer 14. The interface cone 18 was run in ICP-MS for thirty hours. Scanning electron microscope/energy dispersive spectroscopy (SEMS/EDS) analysis only showed the platinum layer, as shown in FIG. 6.

Figures 9A, 9B, 9C:
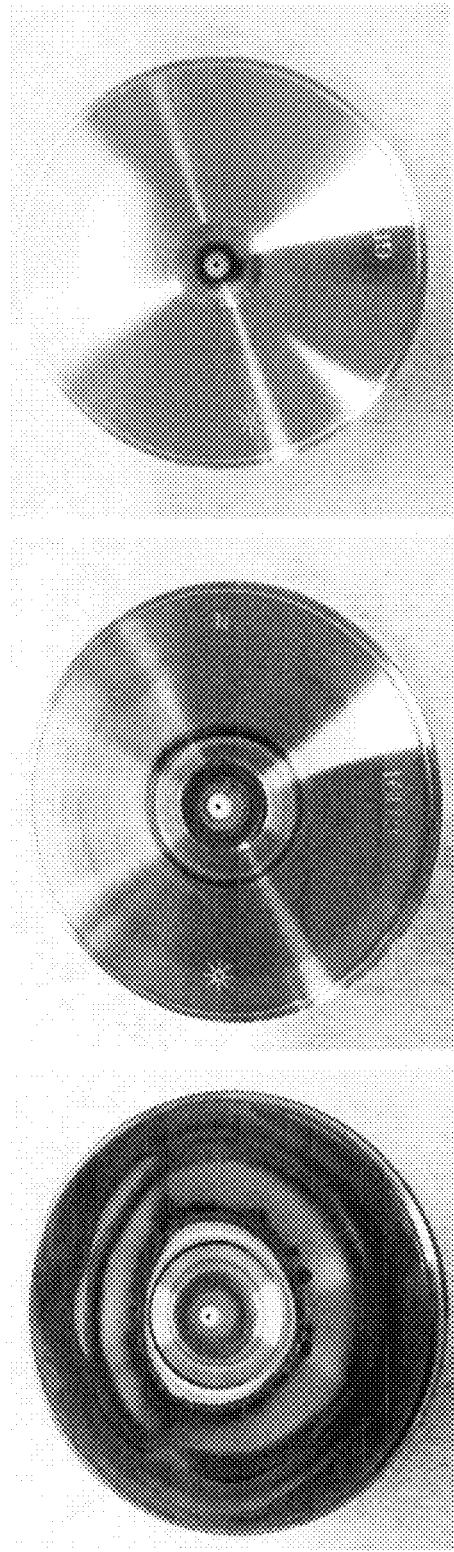
FIGS. 9A-9C illustrate interface cones.

Example 3—FIG. 9A shows an image of an interface cone 18 with a nickel tip 22 and a copper base 20. FIG. 9B shows an interface cone 18 with a nickel tip 22 and a copper base 20 electroplated with nickel. FIG. 9C shows an interface cone 18 with a nickel tip 22 and a copper base 20 with a multilayer coating. The multilayer coating included a diffusion barrier layer, an adhesion layer, and a protective layer. Both titanium and platinum were sputter coated at a rate of 100 nm titanium for 1 μm platinum.

To each interface cone, a composition including 10% aqua regia (3:1 HCL:$HNO_3$) with 100 ppm Ca2+ was applied. The Ca2+ ions deposited easily on the interface cone 18 and repeated deposition and cleaning of the Ca salt caused degradation of the cone surface. In this manner, an accelerated lifetime test of each interface cone 18 was performed.

The composition was allowed to remain on each interface cone 18 as they were run with the ICP-MS for 10 h. The interface cones were examined with SEM/EDS. As shown in FIG. 9A, the copper base corroded easily and included flaky black deposits, which were determined to be copper oxide nanostructures. The interface cone 18 with the multilayer coating (FIG. 9C) looked the cleanest. As mentioned earlier, decreasing the need of interface cone 18 cleaning also increases the lifetime of the interface cone 18 by avoiding improper cleaning and accidental damage during cleaning.

A method of making a coated interface cone, comprising: providing an interface cone having a base and a tip; depositing an adhesion layer to a portion of at least one of the base and the tip; and depositing a protective layer. The method, wherein the protective layer is deposited by sputtering platinum or electroplating platinum. The method of, wherein the adhesion layer is deposited by sputtering. The method, wherein the base is copper; and further comprising depositing a diffusion barrier layer, before the step of depositing the adhesion layer. The method, wherein the diffusion barrier layer is made of at least one material chosen from electrolytic nickel, electroless nickel, and combinations thereof.

From the foregoing description, those skilled in the art can appreciate that the present teachings can be implemented in a variety of forms. Therefore, while these teachings have been described in connection with particular embodiments and examples thereof, the true scope of the present teachings should not be so limited. Various changes and modifications can be made without departing from the scope of the teachings herein.

This scope disclosure is to be broadly construed. It is intended that this disclosure disclose equivalents, means, systems and methods to achieve the devices, activities and mechanical actions disclosed herein. For each device, article, method, mean, mechanical element or mechanism disclosed, it is intended that this disclosure also encompass in its disclosure and teaches equivalents, means, systems and methods for practicing the many aspects, mechanisms and devices disclosed herein. Additionally, this disclosure regards a coating and its many aspects, features and elements. Such a coating can be dynamic in its use and operation, this disclosure is intended to encompass the equivalents, means, systems and methods of the use of the coating and/or an interface cone and its many aspects consistent with the description and spirit of the operations and functions disclosed herein. The claims of this application are likewise to be broadly construed. The description of the inventions herein in their many embodiments is merely exemplary in nature and, thus, variations that do not depart from the gist of the invention are intended to be within the scope of the invention. Such variations are not to be regarded as a departure from the spirit and scope of the invention.

What is claimed is:

1. An interface cone, comprising:
   a base; and
   a tip;
   wherein a portion of at least one of the base and the tip are coated with a multilayer coating, the multilayer coating comprising:
      an adhesion layer deposited onto the portion of at least one of the base and the tip; and
      a protective coating deposited on the adhesion layer, the protective coating comprising a single layer of platinum at a thickness of from about 2 µm to about 6 µm.

2. The interface cone of claim 1, wherein the protective coating applied to the adhesive layer assists in transporting ions from a plasma to a mass spectrometer.

3. The interface cone of claim 1, wherein the protective coating resists degradation when subjected to corrosive acids at a temperature about 1000° C.

4. The interface cone of claim 1, wherein the protective coating is insoluble when exposed to acids having a pH in the range of from about 1 to about 7.

5. The interface cone of claim 1, wherein the protective coating has a platinum purity of greater than about 95% by mass and a density substantially identical to a density of bulk platinum.

6. The interface cone of claim 1, wherein the adhesion layer is made of at least one material chosen from titanium, chromium, tungsten, or a combination thereof.

7. The interface cone of claim 1, wherein the adhesion layer has a thickness of from about 10 nm to about 500 nm.

8. The interface cone of claim 1, wherein the multilayer coating further comprises a diffusion barrier layer deposited between the portion of at least one of the base and the tip and the adhesion layer.

9. The interface cone of claim 8, wherein the diffusion barrier layer is made of at least one material chosen from electrolytic nickel, electroless nickel, or combinations thereof.

10. The interface cone of claim 8, wherein the diffusion barrier layer is present at a thickness greater than 500 nm.

11. The interface cone of claim 1, wherein the base is made of at least one material chosen from copper or nickel.

12. The interface cone of claim 1, wherein the tip is made of at least one material chosen from nickel or platinum.

13. The interface cone of claim 1, wherein the base is copper, and the tip is platinum; and wherein the multilayer coating includes a diffusion barrier layer of nickel applied to the base.

* * * * *